United States Patent [19]
Kumar et al.

[11] Patent Number: 5,893,643
[45] Date of Patent: Apr. 13, 1999

[54] APPARATUS FOR MEASURING PEDESTAL TEMPERATURE IN A SEMICONDUCTOR WAFER PROCESSING SYSTEM

[75] Inventors: Ajay Kumar, Sunnyvale; Jeffrey Chinn, Foster City; Shashank C. Deshmukh, Sunnyvale; Weinan Jiang; Brian Duda, both of San Jose; Rolf Guenther, Monte Sereno; Bruce Minaee, Campbell; Marco Mombelli, Santa Clara; Mark Wiltse, Redwood City, all of Calif.

[73] Assignee: Applied Materials, Inc., Santa Clara, Calif.

[21] Appl. No.: 08/824,099

[22] Filed: Mar. 25, 1997

[51] Int. Cl.⁶ .................................................. G01M 15/00
[52] U.S. Cl. .................. 374/131; 374/121; 250/338.1; 118/712
[58] Field of Search ..................... 374/120, 121, 374/127, 130, 131; 118/712; 250/380.1

[56] References Cited

U.S. PATENT DOCUMENTS

| | | |
|---|---|---|
| 4,435,092 | 3/1984 | Iuchi ........................ 250/338.1 |
| 4,842,683 | 6/1989 | Cheng et al. ................. 156/345 |
| 5,249,142 | 9/1993 | Shirakawa et al. ........... 374/121 |
| 5,549,756 | 8/1996 | Sorensen et al. ............. 118/712 |
| 5,598,014 | 1/1997 | Barany et al. ................ 257/187 |

*Primary Examiner*—George Dombroske
*Assistant Examiner*—Paul D. Amrozowicz
*Attorney, Agent, or Firm*—Raymond Moser

[57] ABSTRACT

Apparatus for measuring wafer support pedestal temperature in a semiconductor wafer processing system. The apparatus measures infrared energy emitted by the bottom of the pedestal via a tube having one end inserted in a bore through the underside of the cathode pedestal base. The distal end of the tube is coupled to a temperature sensor. Both the tube and temperature sensor are fitted with insulating sleeve adapters to suppress unwanted RF signals from coupling to the sensor.

15 Claims, 3 Drawing Sheets ns of the present invention can be readily

APPARATUS FOR MEASURING PEDESTAL TEMPERATURE IN A SEMICONDUCTOR WAFER PROCESSING SYSTEM

BACKGROUND OF THE INVENTION

1. Field of the Invention

The invention relates generally to instrumentation used to measure operating conditions inside a semiconductor wafer processing chamber and, more specifically, to an apparatus for measuring pedestal temperatures by detecting infrared wavelength energy emissions from the pedestal.

2. Description of the Background Art

The materials and processes used to process a semiconductor wafer in a semiconductor wafer processing system are extremely temperature sensitive. Should these materials be exposed to excessive temperatures resulting from poor heat stabilization or transfer, yield or performance of the end product wafer may be compromised. Additionally, if process temperatures are not properly controlled, the boiling points of the metals and alloys used to create the desired circuit pathways on the wafer may be exceeded. As a result, the wafer and circuitry thereupon can be damaged. Since the pedestal is in intimate contact with the wafer and serves both as a heat sink and wafer support, measuring the temperature of the pedestal provides a good indication of the wafer temperature.

Most pedestals are cooled by conduction to a water cooled cathode base where a constant flow of water removes excess heat. Having established that the pedestal temperature is a good measure of the wafer temperature during processing, different means to measure the pedestal temperature have been used in the prior art. One method of determining pedestal temperature is to measure the temperature of the cooling water at the outlet of the cathode base. Unfortunately, this method is limited in that the temperature measured is neither an accurate nor timely measure of the pedestal temperature. The water temperature in the cathode base is measured after the heat has passed through several interfaces, conduits, and heat sinks. With unreliable, delayed data determining the proper feedback control system parameters, temperature stabilization is difficult using this technique to measure wafer temperature.

A second technique attempts to measure the pedestal temperature directly during wafer processing by placing thermocouple probes in contact with the pedestal. However, thermocouple probes placed in direct contact with the pedestal are unfortunately subjected to RF interference from a plasma used to process the wafer. As such, it is not possible to obtain an accurate temperature measurement by this approach either.

A third technique uses a temperature sensitive phosphor sensor. The sensor is mounted inside the chamber with a fiber optic cable attached to the sensor. The phosphor emits a fluorescent glow dependent upon the temperature of the phosphor. This "signal", is then transmitted by the fiber optic cable for monitoring purposes.

A fourth technique involves diffused reflectance spectroscopy. One wavelength of light reflected from the wafer surface is chosen for monitoring. A spectrometer measures the level of backscattering of the chosen wavelength (with specific energy and related temperature characteristics) to derive a wafer temperature. However, both the third and fourth techniques use extremely expensive equipment that is prone to damage in the harsh environments of a wafer processing chamber. As such, existing devices cannot provide an accurate and stable measurement of pedestal temperature that is necessary and desirable for processing semiconductor wafers.

Therefore, there exists a need in the art for an apparatus that can provide an accurate, real-time measurement of pedestal temperature with a relatively simple and rugged design to withstand a processing chamber environment.

SUMMARY OF THE INVENTION

The disadvantages heretofore associated with the prior art are overcome by an apparatus for measuring pedestal temperature in a wafer processing system. The inventive apparatus locates sensing and measuring equipment below the pedestal that supports the wafer. Specifically, a first end of a tube contacts the bottom of the pedestal. A second end of the tube is connected to a commercially available temperature sensor for measuring temperature based on the infrared (IR) energy propagated by the tube from the pedestal. The apparatus has sleeves for the tube and temperature sensor which insulate these components from stray energy sources. The sleeves also secure the sensor and tube to each other and to the processing chamber. The tube is preferably a polished metal such as aluminum or stainless steel. A shielding sleeve cylindrically encases the tube and is preferably fabricated from ceramic or quartz. An adaptive sleeve, preferably fabricated from the same material as that of the shielding sleeve, has an axial bore at its top end. The adaptive sleeve also has a diameter slightly larger than the diameter of the shielding sleeve. As such, the adaptive sleeve accommodates the second end of the tube and shielding sleeve. A hollow threaded fitting at the bottom end of the adaptive sleeve axially abuts the axial bore for engaging the temperature sensor. The temperature sensor is capable of conventionally detecting and measuring the magnitude of infrared energy.

In operation, as the wafer and pedestal are heated, the bottom of the pedestal emits IR energy. The IR energy propagates along the tube to the IR sensor. The sensor converts the IR energy into a voltage that accurately represents the temperature of the pedestal. The invention reduces the noise coupled to the sensor, thus providing a ore accurate measure of pedestal temperature than has heretofore been available.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
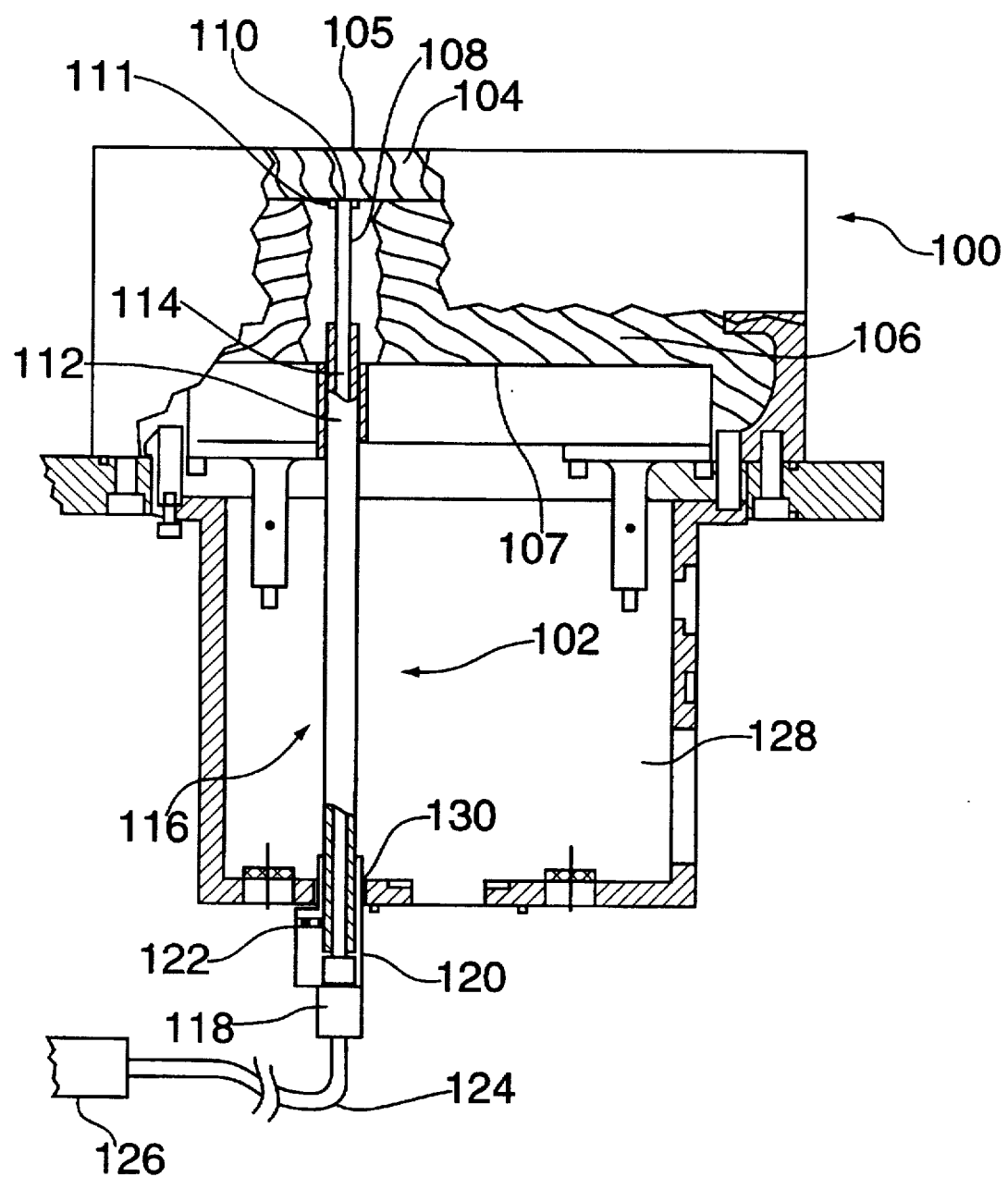
FIG. 1 is a partial elevation view of a pedestal assembly of a wafer processing chamber containing the inventive apparatus.

FIG. 1 depicts a partial view of a pedestal assembly 100 within a plasma reaction chamber with the inventive apparatus 102 assembled and in place. For a detailed understanding of the plasma reaction chamber and its operation in processing a wafer, the reader should refer to the drawings and the detailed description contained in U.S. Pat. No. 4,842,683, issued Jun. 27, 1989, incorporated herein by reference. That disclosure discloses a biased, high density plasma reaction chamber manufactured by Applied Materials, Inc. of Santa Clara, Calif.

Specifically, the pedestal assembly 100 contains a pedestal 104 supported by a cathode pedestal base 106. The pedestal 104 supports a wafer, not shown, which is to be processed while resting on a surface 105. A bore 108 is drilled through the cathode pedestal base 106. The bore 108 allows the apparatus 102 line of sight access from an opening 130 in an RF enclosure 128 below the cathode pedestal base 106 to the pedestal 104. At a bottom surface 107 of the cathode pedestal base 106, the bore 108 is drilled to a larger diameter and is threaded. The threaded portion of the bore 108 communicates with a threaded portion of the apparatus 102 for securing the apparatus 102 to the pedestal base 106. An O-ring seal 111, located between the cathode pedestal base 106 and the pedestal 104, ensures vacuum integrity within the chamber and prevents the chamber atmosphere from contaminating the apparatus 102.

The apparatus 102 is essentially fabricated from two major components, a waveguide 116 and a temperature sensor 118. The waveguide 116 and the temperature sensor 118 are surrounded by sleeves 112 and 120, respectively. These sleeves interrupt the continuous conductive path between the waveguide 116 and the temperature sensor 118 thereby preventing any stray electrical energy from coupling to the sensor 118 and interfering with the temperature measuring process. Specifically, the waveguide 116 contains a hollow, metal tube 114 with an outer diameter slightly smaller than that of the bore 108. The tube 114 is inserted into the bore 108 so that one end (a first end) fits snugly in the bore 108 and rests flush with the top of the cathode pedestal base 106. The tube 114 thereby communicates with the bottom of the pedestal 104 at a contact point 110. Preferably, the tube 114 is fabricated of a metal that has a high reflectance at infrared (IR) wavelengths such as aluminum or stainless steel. The inner surface is polished to a nearly mirror finish to provide sufficient infrared radiation propagation. The shielding sleeve 112 serves to secure the tube 114 to the pedestal base 106 as well as insulate the tube from resident RF energy which may interfere with temperature measurements.

Specifically, the shielding sleeve 112 is a cylinder of insulating material with an inner diameter equal to that of the bore 108 in the pedestal 104 and cathode pedestal base 106. Threads are provided at a top end of the sleeve 112 which communicate with the threaded portion of the cathode pedestal base 106. The insulating material of the cylinder is suitable for shielding the tube 114 from other nearby energy sources (i.e., electrical noise). The insulating material is preferably ceramic or quartz.

The waveguide 116 extends through the cathode pedestal base 106 and the opening 130 in the RF enclosure 128 below the cathode pedestal base 106. Another end (the second end) of the tube 114 is joined to the IR temperature sensor 118. The IR temperature sensor 118 may be of any type capable of accurately measuring a wide temperature range (e.g., 0 to 500° C. with an error of ±0.1° C.). Such a sensor is a model selected from the Thermalert® MI™ series of miniature infrared temperature sensors manufactured by Raytek, Inc. of Santa Cruz, Calif. The waveguide 116 and temperature sensor 118 are joined by an adaptive sleeve 120 having two open ends. The adaptive sleeve 120 is also fabricated from insulating material similar to that of the shielding sleeve 112 for shielding the sensor 118 from localized RF interference.

Figure 2A:
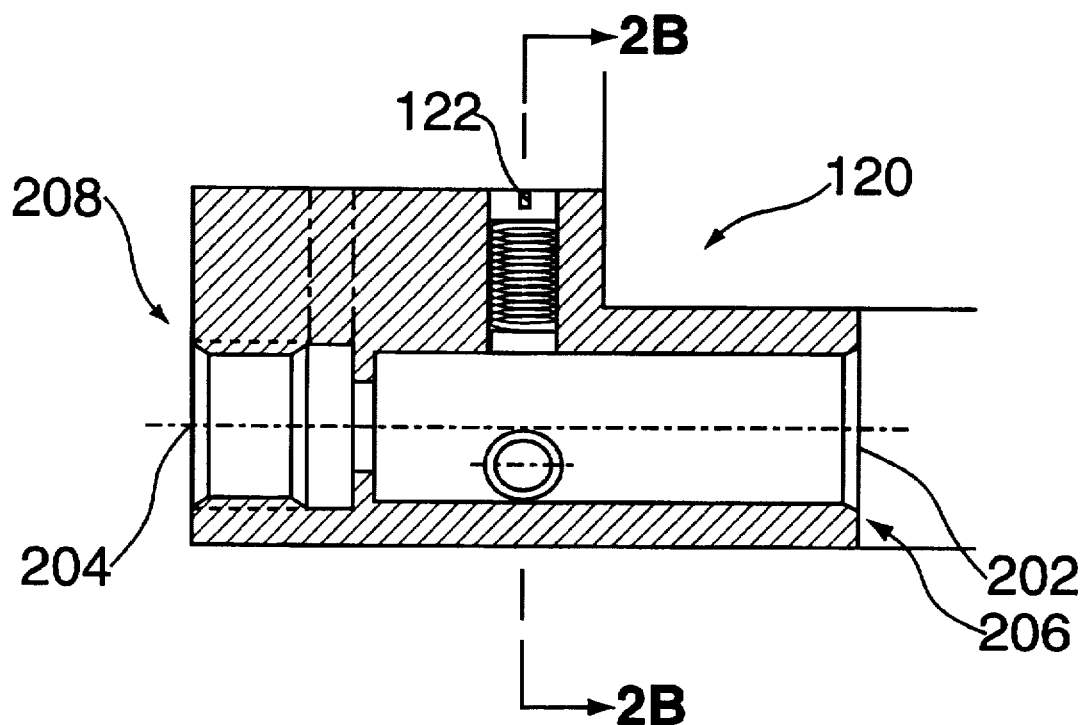
FIG. 2A is a detailed cross-sectional view of the adaptive sleeve of the inventive apparatus.
Figure 2B:
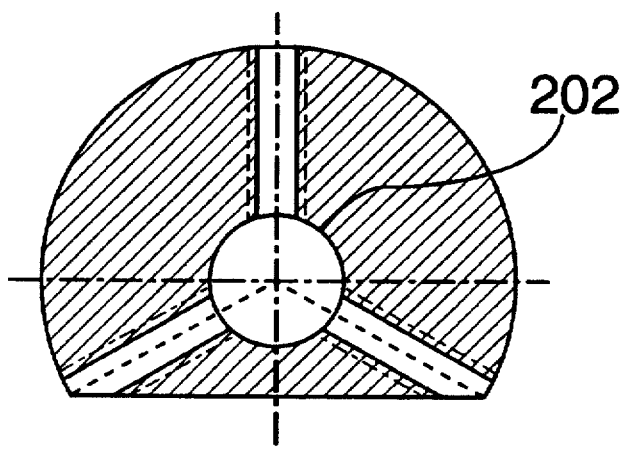
FIG. 2B is a detailed cross-sectional view of the adaptive sleeve of the inventive apparatus as seen along lines 2B—2B of FIG. 2A.

A detailed cross-sectional view of the adaptive sleeve 120 is depicted in FIG. 2A. Specifically, the adaptive sleeve 120 has a bore 202 at one end 206 to accommodate the waveguide 116 of FIG. 1 (not shown in FIG. 2A). The waveguide is secured to the sleeve 120 by spring plungers 122 located radially about the sleeve 120. FIG. 2B is a cross-sectional view of the adaptive sleeve 120 as seen along lines 2B—2B of FIG. 2A which depicts a preferred pattern for the spring plunger arrangement. Preferably, there are three plungers equilaterally spaced apart. Another end 208 of the sleeve is provided with a threaded fitting 204 axially abutting the bore 202 to accommodate a threaded sensing head (not shown) of the sensor 118 of FIG. 1. The sensor 118 is fitted with a cable 124 for transmitting signals from the sensor 118 to processing circuitry 126 (shown in FIG. 1) located external to the process chamber.

With the configuration discussed above, the inventive apparatus 102 is capable of detecting heat (in the form of IR radiation) at the pedestal 104 without exposing delicate or physically consumable instrumentation to the hostile chamber environment. The waveguide 116 directs the infrared energy emitted from the contact point 110 to the IR sensitive element of the sensor 118. The sensor converts the IR energy into an electrical signal that is coupled to the instrumentation 126. The high energy RF at the pedestal 104 and the interfering electrical noise are isolated from the sensor 118 and tube 114 by the insulating sleeves 112 and 120. These sleeves interrupt the continuous conductive path between the waveguide 116 and the sensor element thereby preventing any stray electrical energy from contaminating the IR measurement. Furthermore, positioning the sensor 118 a distance from the plasma reduces the RF interference coupled from the plasma to the sensor. The cable 124 connecting the sensor 118 and the remote processing circuitry 126 is further shielded to prevent the introduction of stray signals.

The processing circuitry 126 monitors the sensor measurements and creates the necessary data signals for a temperature control unit. As such, the temperature readings are highly accurate and measured in real time for rapid control of operating parameters. Additionally, the entire apparatus is located outside the process chamber and does not contain moving or consumable components. The materials used are also much less expensive in overall cost to produce, install and maintain than previously known temperature measurement devices used in the art.

Figure 3:
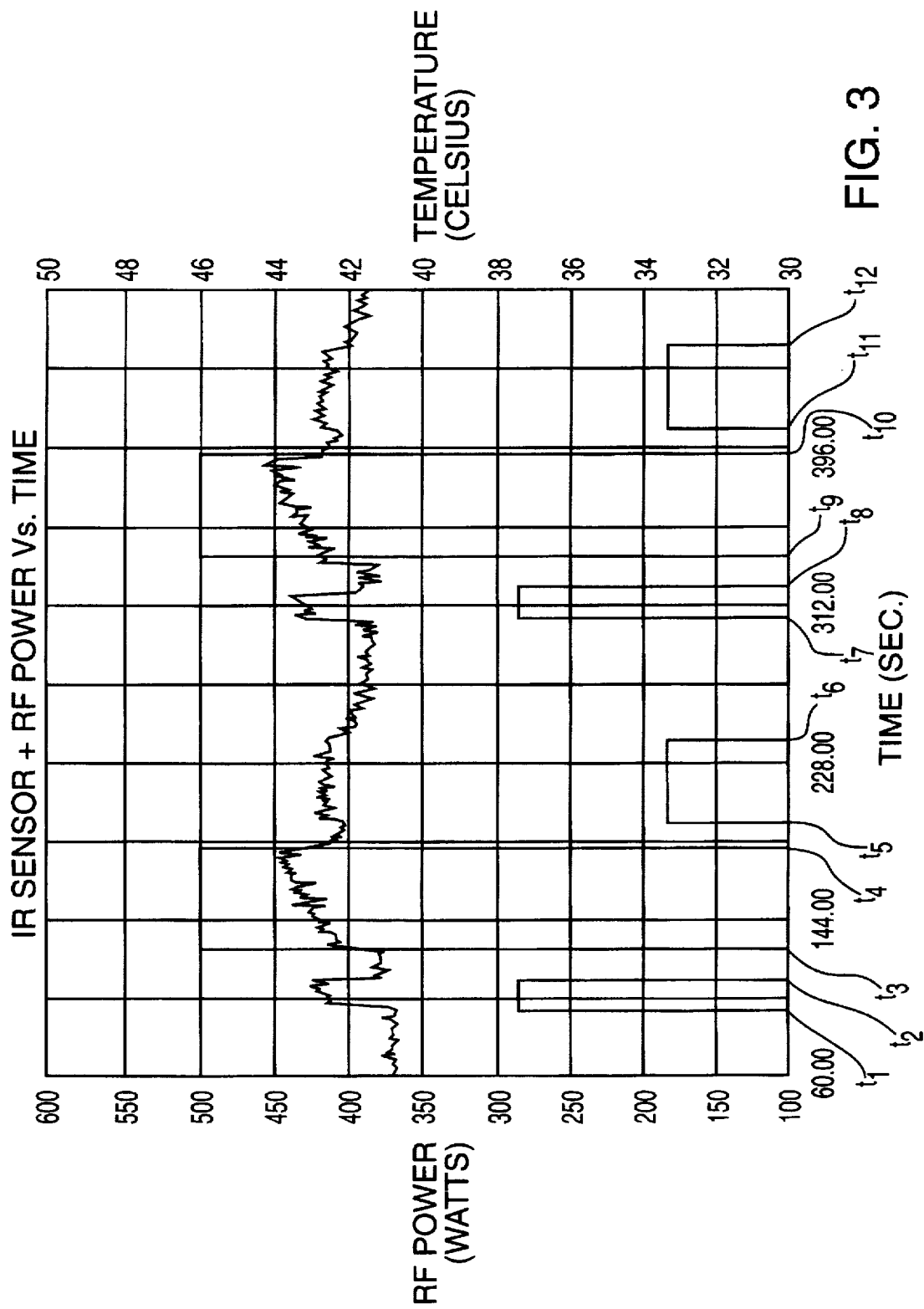
FIG. 3 is a graph of pedestal temperature and RF power vs. time.

FIG. 3 is a graph of pedestal temperature as measured by the invention and RF power level vs. time. This graph confirms the real-time temperature measurement characteristic of the inventive apparatus. At every instance that the RF power is applied to the chamber (indicated by the vertical lines at $t=t_{1,3,5,7,9 \& 11}$), there is an almost immediate increase in measured pedestal temperature. Correspondingly, rapid reductions in measured pedestal temperature are also noted when the RF power is deactivated at $t=t_{2,4,6,8,10 \& 12}$.

Although various embodiments which incorporate the teachings of the present invention have been shown and described in detail herein, those skilled in the art can readily devise many other varied embodiments that still incorporate these teachings.

What is claimed is:

1. Apparatus for measuring a temperature of a pedestal in a processing chamber of a semiconductor wafer processing system comprising:

(a) a tube for propagating infrared energy from a first end of the tube to a second end of the tube, the first end of the tube contacting the pedestal, the tube having a diameter; and (b) a temperature sensor, located at the second end of the tube, for measuring temperature in response to the infrared energy propagated by the tube.

2. The apparatus of claim 1 further comprising a pedestal base for supporting the pedestal and means for shielding the tube from stray energy sources and securing the tube to the pedestal base.

3. The apparatus of claim 2 further comprising means for shielding the tube from stray energy sources and attaching the tube to the temperature sensor.

4. The apparatus of claim 3 wherein the means for shielding the tube from stray energy sources and securing the tube to the pedestal base is a shielding sleeve surrounding the tube and engaging a lower portion of the pedestal base.

5. The apparatus of claim 4 wherein the means for attaching the tube to the temperature sensor is an adaptive sleeve having a top end surrounding the shielding sleeve and the second end of the tube and a bottom end engaging the temperature sensor.

6. The apparatus of claim 4 wherein the shielding sleeve is cylindrical with an axial bore having a diameter slightly larger than the diameter of the tube.

7. The apparatus of claim 4 wherein the shielding sleeve is ceramic.

8. The apparatus of claim 4 wherein the shielding sleeve is quartz.

9. The apparatus of claim 5 wherein the adaptive sleeve further comprises an axial bore at the top end having a diameter slightly larger than the diameter of the shielding sleeve and a hollow threaded fitting at a bottom end axially abutting the axial bore.

10. The apparatus of claim 9 wherein a sensor head of the temperature sensor is provided with threads for communicating with the hollow threaded fitting of the adaptive sleeve.

11. The apparatus of claim 2 wherein the tube is a polished metal.

12. The apparatus of claim 11 wherein the tube is aluminum.

13. The apparatus of claim 11 wherein the tube is stainless steel.

14. The apparatus of claim 1 wherein the temperature sensor is an infrared temperature sensor.

15. Apparatus for measuring a temperature of a pedestal in a processing chamber of a semiconductor wafer processing system comprising:

(a) a pedestal base for supporting the pedestal, (b) a tube for propagating infrared energy from a first end of the tube to a second end of the tube, the first end of the tube contacting the pedestal and passing through a bore in the pedestal base, and the tube having a diameter smaller than said bore;

(c) an infrared temperature sensor, located at the second end of the tube, for measuring temperature in response to the infrared energy propagated by the tube, said infrared temperature sensor having a sensor head provided with a threaded coupling; and (d) a ceramic cylindrical shielding sleeve with an axial bore having a diameter slightly larger than the diameter of the tube thereby surrounding the tube and engaging a lower portion of the pedestal base for shielding the tube and securing the tube to the pedestal base.

(e) a ceramic adaptive sleeve for shielding the tube and attaching the tube to the temperature sensor, the adaptive sleeve having an axial bore at a top end, the axial bore having a diameter slightly larger than the diameter of the shielding sleeve thereby surrounding the shielding sleeve and the second end of the tube, a hollow threaded fitting at a bottom end, axially abutting the axial bore for communicating with the threaded coupling of the sensor head.

* * * * *